United States Patent [19]

Baliga

[11] Patent Number: 5,198,687
[45] Date of Patent: Mar. 30, 1993

[54] BASE RESISTANCE CONTROLLED THYRISTOR WITH SINGLE-POLARITY TURN-ON AND TURN-OFF CONTROL

[75] Inventor: Bantval J. Baliga, Raleigh, N.C.

[73] Assignee: North Carolina State University at Raleigh, Raleigh, North Carolina

[21] Appl. No.: 919,161

[22] Filed: Jul. 23, 1992

[51] Int. Cl.[5] .................. H01L 29/74; H01L 29/10; H01L 29/78

[52] U.S. Cl. ............................ 257/137; 257/146; 257/335; 257/365; 257/402

[58] Field of Search ............... 357/38, 23.4, 23.14, 357/23.12, 46

[56] References Cited

U.S. PATENT DOCUMENTS

| | | |
|---|---|---|
| 4,760,431 | 7/1988 | Nakagawa et al. ............ 357/23.4 |
| 4,914,496 | 4/1990 | Nakagawa et al. ............ 357/38 |
| 4,928,155 | 5/1990 | Nakagawa et al. ............ 357/23.4 |
| 4,954,869 | 9/1990 | Bauer ............................. 357/38 |
| 4,956,690 | 11/1990 | Kato ............................... 357/38 |
| 4,959,703 | 9/1990 | Ogura et al. .................. 357/38 |
| 4,963,972 | 10/1990 | Shinobe et al. ................ 357/38 |
| 5,014,102 | 5/1991 | Adler .............................. 357/38 |
| 5,086,323 | 2/1992 | Nakagawa et al. ............ 357/23.4 |
| 5,089,864 | 2/1992 | Sakurai .......................... 357/23.4 |
| 5,091,766 | 2/1992 | Terashima ...................... 357/38 |
| 5,093,701 | 3/1992 | Nakagawa et al. ............ 357/23.4 |
| 5,099,300 | 3/1992 | Baliga ............................. 357/37 |
| 5,105,244 | 5/1992 | Bauer ............................. 357/23.4 |
| 5,144,401 | 9/1992 | Ogura et al. .................. 357/38 |

OTHER PUBLICATIONS

Baliga, Adler, Gray and Love, "The Insulated Gate Rectifier (IGR): A New Power Switching Device", IEEE, IEDM-82, pp. 264-267, 1982.

Temple, "MOS Controlled Thyristors (MCT'S)", IEDM-84, pp. 282-285, 1984.

Baliga, Adler, Love, Gray and Zommer, "The Insulated Gate Transistor: A New Three-Terminal MOS-Controlled Bipolar Power Device", IEEE Transactions on Electron Devices, vol. ED-31, No. 6, pp. 821-828, Jun. 1984.

Baliga and Chang, "The MOS Depletion-Mode Thyristor: A New MOS-Controlled Bipolar Power Device", IEEE Electron Device Letters, vol. 8, No. 8, pp. 411-413, Aug. 1988.

Baliga, "The MOS-Gated Emitter Switched Thyristor", IEEE Electron Device Letters (reprint), vol. 11, No. 2, pp. 75-77, Feb. 1990.

Nandakumar, Baliga, Shekar, Tandon and Reisman, "A New MOS-Gated Power Thyristor Structure with Turn-off Achieved by Controlling the Base Resistance", IEEE Electron Letters, vol. 12, No. 5, pp. 227-229, May, 1991.

Shekar, Baliga, Nandakumar, Tandon and Reisman, "Characteristics of the Emitter-Switched Thyristor", IEEE Transactions on Electron Devices, vol. 38, No. 7, pp. 1619-1623, Jul. 1991.

Nandakumar, Baliga, Shekar, Tandon and Reisman, "The Base Resistance Controlled Thyristor (BRT) 'A New MOS Gated Power Thyristor'", IEEE, pp. 138-141, 1991.

Shekar, Baliga, Nandakumar, Tandon and Reisman, "Experimental Demonstration of the Emitter Switched Thyristor", pp. 128-131.

Primary Examiner—Andrew J. James
Assistant Examiner—Ngan Van Ngo
Attorney, Agent, or Firm—Bell, Seltzer, Park & Gibson

[57] ABSTRACT

A base resistance controlled thyristor with single-polarity and dual-polarity turn-on and turn-off control includes a turn-off device provided between the second base region and the cathode of a thyristor. Controlled turn-off is provided by either a near-zero positive bias or a negative bias being applied to the turn-off device. In the preferred embodiment, the turn-off device is a P-channel depletion-mode MOSFET in the surface of a semiconductor substrate. Accordingly, an accumulation-layer channel can be formed between the second base region and the cathode in response to a negative bias. Alternatively, if single-polarity control is desired, the P-type channel is provided to turn-off the device in response to a near-zero positive bias. In either type of operation, however, advantages are obtained over conventional turn-off devices wherein inversion-layer channels are used.

25 Claims, 8 Drawing Sheets

BASE RESISTANCE CONTROLLED THYRISTOR WITH SINGLE-POLARITY TURN-ON AND TURN-OFF CONTROL

FIELD OF THE INVENTION

The present invention relates to semiconductor switching devices, and more particularly to thyristors with single-polarity and dual-polarity MOS-gated control.

BACKGROUND OF THE INVENTION

The development of semiconductor switching technology for high power applications in motor drive circuits, appliance controls and lighting ballasts, for example, began with the bipolar junction transistor. As the technology matured, bipolar devices became capable of handling large current densities in the range of 40–50 A/cm$^2$, with blocking voltages of 600 V.

Despite the attractive power ratings achieved by bipolar transistors, there exist several fundamental drawbacks to the suitability of bipolar transistors for all high power applications. First of all, bipolar transistors are current controlled devices. Accordingly, a large control current into the base, typically one fifth to one tenth of the collector current, is required to maintain the device in an operating mode. Even larger base currents, however, are required for high speed forced turn-off. These characteristics make the base drive circuitry complex and expensive. The bipolar transistor is also vulnerable to breakdown if a high current and high voltage are simultaneously applied to the device, as commonly required in inductive power circuit applications, for example. Furthermore, it is difficult to parallel connect these devices since current diversion to a single device occurs at high temperatures, making emitter ballasting schemes necessary.

The power MOSFET was developed to address this base drive problem. In a power MOSFET, a gate electrode bias is applied for turn-on and turn-off control. Turn-on occurs when a conductive channel is formed between the MOSFET's source and drain regions under appropriate bias. The gate electrode is separated from the device's active area by an intervening insulator, typically silicon dioxide. Because the gate is insulated from the active area, little if any gate current is required in either the on-state or off-state. The gate current is also kept small during switching because the gate forms a capacitor with the device's active area. Thus, only charging and discharging current ("displacement current") is required. The high input impedance of the gate, caused by the insulator, is a primary feature of the power MOSFET. Moreover, because of the minimal current demands on the gate, the gate drive circuitry and devices can be easily implemented on a single chip. As compared to bipolar technology, the simple gate control provides for a large reduction in cost and a significant improvement in reliability.

These benefits are offset, however, by the high on-resistance of the MOSFET's active region, which arises from the absence of minority carrier injection. As a result, the device's operating forward current density is limited to relatively low values, typically in the range of 10 A cm$^2$, for a 600 V device, as compared to 40–50 A/cm$^2$ for the bipolar transistor.

Figure 1:
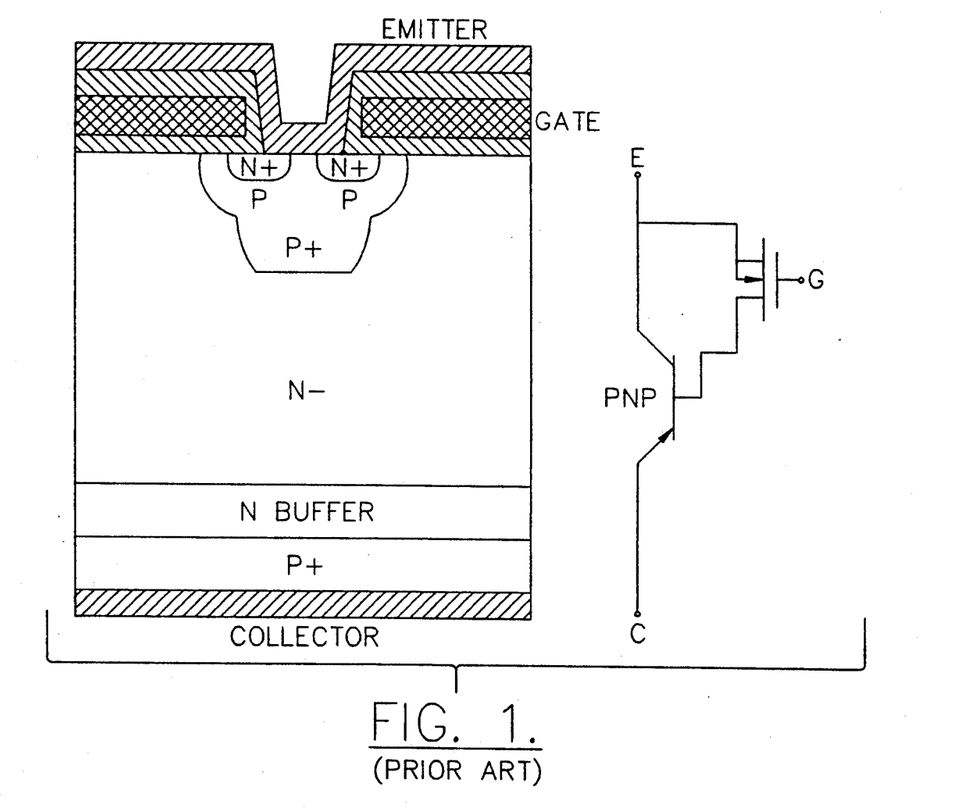
FIG. 1 illustrates a cross-sectional representation of a prior art Insulated Gate Bipolar Transistor (IGBT).

On the basis of these features of power bipolar transistors and MOSFET devices, hybrid devices embodying a combination of bipolar current conduction with MOS-controlled current flow were developed and found to provide significant advantages over single technologies such as bipolar or MOSFET alone. Thus, in the Insulated Gate Bipolar Transistor (IGBT), disclosed in an article by inventor B. J. Baliga, M. S. Adler, R. P. Love, P. V. Gray and N. Zommer, entitled "The Insulated Gate Transistor: A New Three terminal MOS Controlled Bipolar Power Device," IEEE Trans. Electron Devices, ED-31, pp. 821–828 (1984), on-state losses were shown to be greatly reduced when compared to power MOSFETs. This was caused by the conductivity modulation of the IGBT's drift region during the on-state. Moreover, very high conduction current densities in the range of 200–300 A/cm$^2$ can also be achieved. Accordingly, an IGBT can be expected to have a conduction current density approximately 20 times that of a power MOSFET and five (5) times that of an equivalent bipolar transistor. Typical turn-off times for the IGBT can be expected to be in the range of 10–50 $\mu$s. A cross-sectional representation of a typical insulated gate bipolar transistor is shown in FIG. 1.

Although gate-controlled bipolar transistors, such as the IGBT, represent an improvement over using bipolar or MOSFET devices alone, even lower conduction losses can be expected by using a thyristor. This is because thyristors offer a higher degree of conductivity modulation and a lower forward voltage drop when turned on. Consequently, the investigation of thyristors is of great interest so long as adequate methods for providing forced gate turn-off can also be developed. As will be understood by one skilled in the art, a thyristor in its simplest form comprises a four-layer P1-N1-P2-N2 device with three P-N junctions in series: J1, J2, and J3, respectively. The four layers correspond to the anode (P1), the first base region (N1), the second base or P-base region (P2) and the cathode (N2), respectively. In the forward blocking state, the anode is biased positive with respect to the cathode and junctions J1 and J3 are forward biased and J2 is reversed-biased. Most of the forward voltage drop occurs across the central junction J2. In the forward conducting state, all three junctions are forward biased and the voltage drop across the device is very low and approximately equal to the voltage drop across a single forward biased P-N junction.

An inherent limitation to the use of thyristors for high current applications is sustained latch-up, however, arising from the coupled P1-N1-P2 and N1-P2-N2 bipolar transistors which make up the four layers of the thyristor. This is because sustained thyristor latch-up can result in catastrophic device failure if the latched-up current is not otherwise sufficiently controlled by external circuitry or by reversing the anode potential. Sustained latch-up can occur, for example, when the summation of the current gains for the thyristor's regeneratively coupled P1-N1-P2 and wide base P1-N2-P2 transistors exceeds unity. An alternative to providing external circuitry or reversing the anode potential to obtain turn-off, however, is to use a MOS-gate for controlling turn-on and turn-off.

Figure 2:
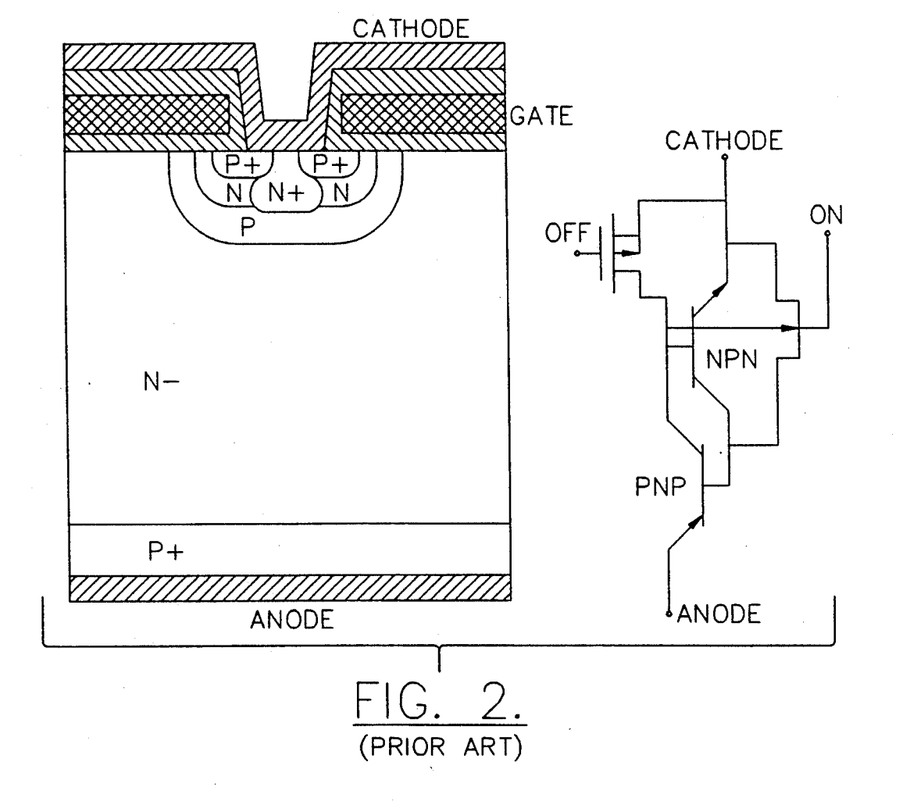
FIG. 2 illustrates a cross-sectional representation of a prior art MOS-Controlled Thyristor (MCT).

Several methods for obtaining MOS-gate control over thyristor action, including latch-up, exist. For example, in the MOS-controlled thyristor (MCT), turn-off is provided by shorting the emitter-base junction of the N-P-N transistor to thereby produce a reduction in gain. This raises the holding current of the thyristor to a level above the operating current level. Accordingly, an MCT structure has been reported which utilizes a P-channel MOSFET integrated into the cathode region of a thyristor for turn-off control, and an N-channel MOSFET integrated into the P-base region for turn-on control, as shown in FIG. 2. This device and its complementary counterpart are described in an article by V. A. K. Temple, entitled "The MOS Controlled Thyristor," published in IEDM Technology Digest, Abstract 10.7, pp. 282–285, (1984).

The turn-off enhancement-mode MOSFET for the reported MCT structure shown in FIG. 2 is activated by a negative bias and provides an electrical short between the cathode contact and the P-base region. The electrical short comprises an inversion-layer channel in the cathode region. Turn-on is provided by an enhancement-mode MOSFET. However, a positive bias is required to provide an electrical path between the cathode region and the N− drift region. Accordingly, a dual-polarity control signal is required for operation. Because the maximum controllable turn-off current density is inversely related to the channel resistance of the turn-off FET, inversion-layer controlled turn-off is not preferred because of the inversion-layer channel's relatively high resistance.

Figure 3:
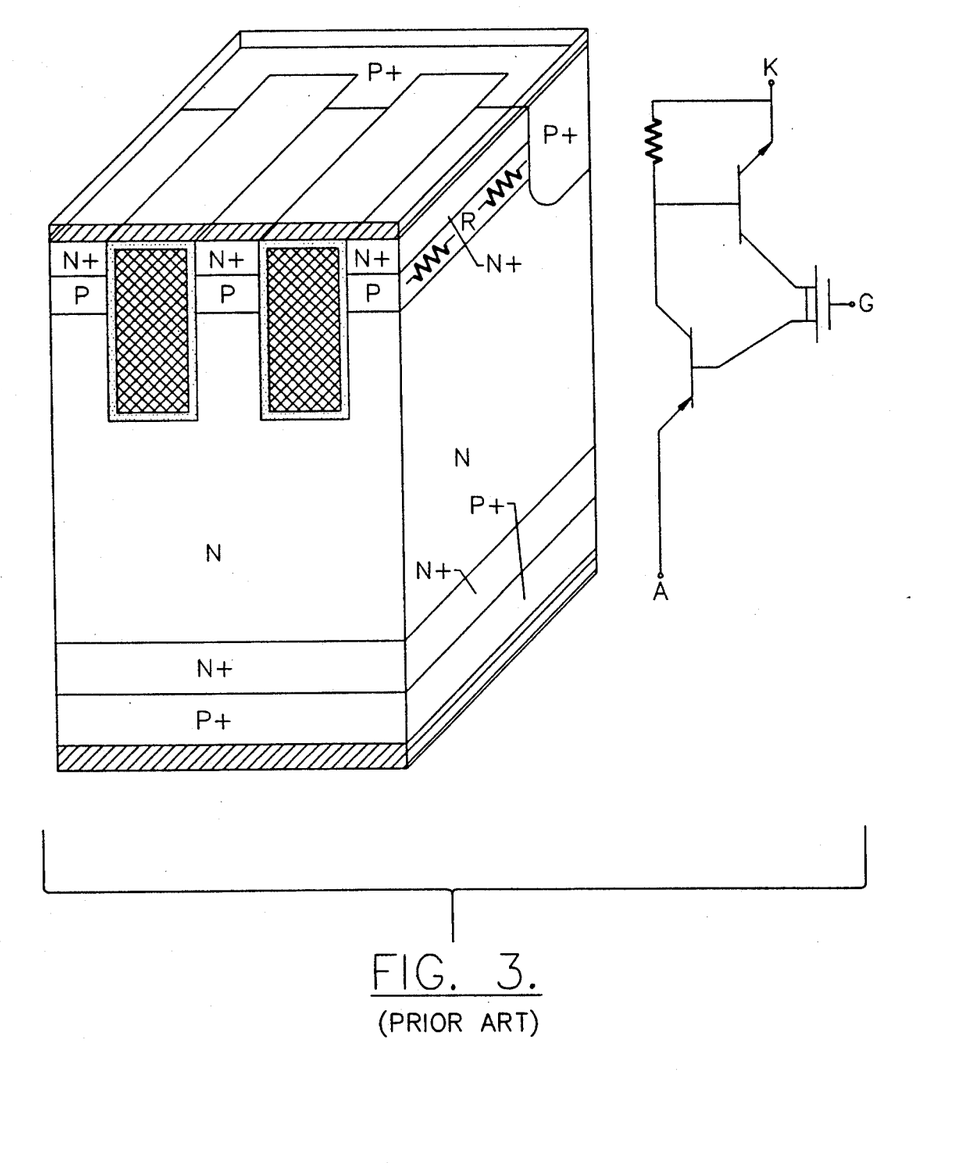
FIG. 3 illustrates a cross-sectional representation of a prior art Depletion-mode Thyristor (DMT).

Other examples of MOS-gated thyristors include the depletion-mode thyristor (DMT), shown in FIG. 3, which overcame many of the drawbacks associated with the MCT. In the DMT, a depletion-mode MOSFET is placed in series with the base of the P-N-P transistor. Accordingly, once the thyristor is turned-on, current flow can be shut off by application of a negative gate bias. This eliminates the base drive by pinching off the base current to the P-N-P transistor and shuts off the device. Like the reported MCT, the DMT requires gate control signals of opposite polarity for turn-on and turn-off control.

Figures 4A, 4B:
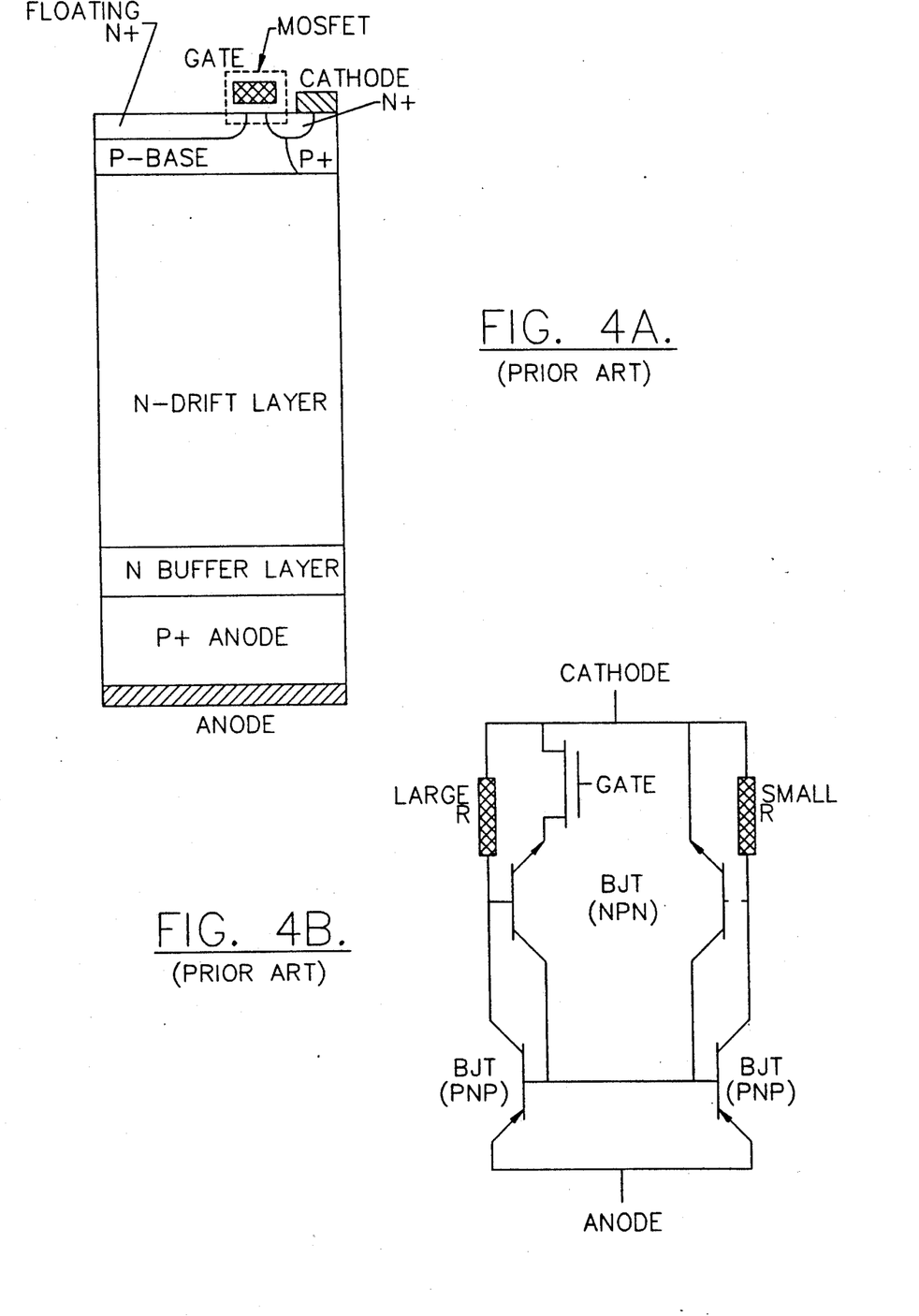
FIG. 4A illustrates a cross-sectional representation of a prior art Emitter Switched Thyristor (EST).
FIG. 4B illustrates an equivalent electrical circuit schematic for the EST shown in FIG. 4A.

In another device, described in an article entitled "The MOS-Gated Emitter Switched Thyristor," by inventor Baliga, published in IEEE Electron Device Letters, Vol. 11, No. 2, pp. 75–77, February, 1990, turn-on is achieved by forcing the thyristor current to flow through an N-channel enhancement-mode MOSFET and floating N+ emitter integrated within the P-base region. This article is hereby incorporated herein by reference. A cross-sectional representation of this structure and equivalent circuit is shown in FIGS. 4A and 4B, which are reproductions of FIG. 1 from the aforesaid Baliga article. As will be understood by one skilled in the art, the length of the floating N+ emitter region, which determines the value of large resistance R shown in FIG. 4B, controls the holding and triggering current for the device. Turn-off of the emitter switched device (EST) is accomplished by reducing the gate voltage on the MOSFET to below the threshold voltage. This cuts off the floating N+ region from the cathode and shuts-off the device. Although turn-on and turn-off of the EST can be provided by varying a single-polarity control signal, the maximum controllable turn-off current density is limited by the turn-off characteristics of the device.

Figure 5:
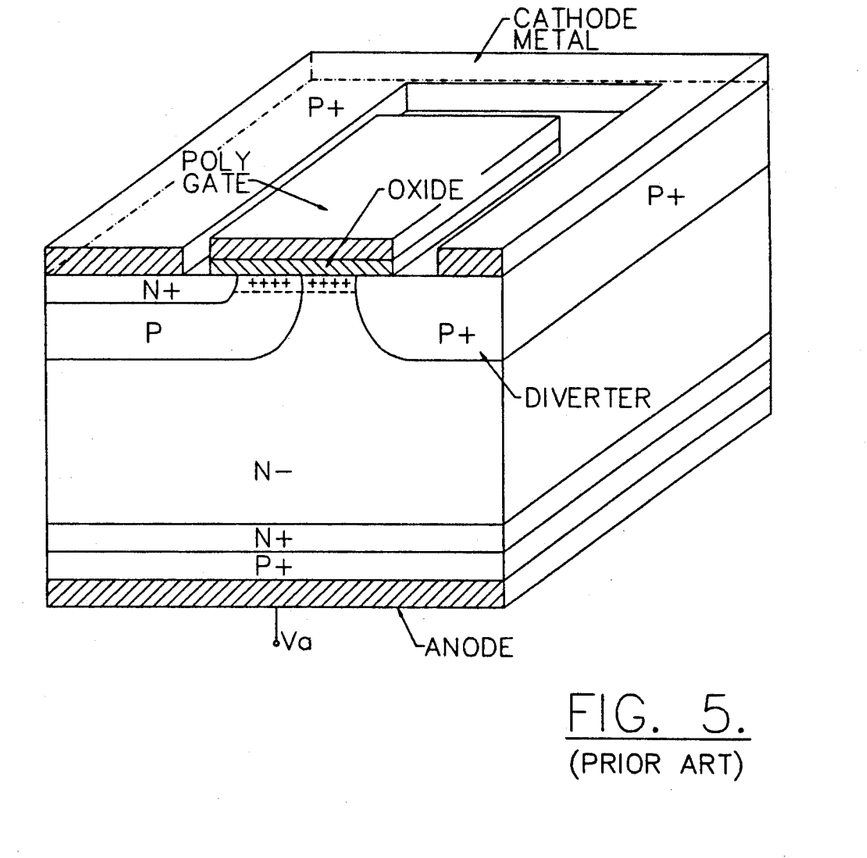
FIG. 5 illustrates a three-dimensional cross-sectional representation of a prior art Base Resistance Controlled Thyristor (BRT).

More recently, a base resistance controlled thyristor (BRT) was described in U.S. Pat. No. 5,099,300, to Baliga, and an article entitled "A New MOS-Gated Power Thyristor Structure with Turn-Off Achieved by Controlling the Base Resistance," by M. Nandakumar, inventor B. J. Baliga, M. Shekar, S. Tandon and A. Reisman, IEEE Electron Device Letters, Vol. 12, No. 5, pp. 227–229, May, 1991, both of which are hereby incorporated herein by reference. The BRT operates by modulating the lateral P-base resistance of the thyristor using MOS gate control. Operational BRTs with 600-volt forward blocking capability, such as the one shown in FIG. 5, have been developed. FIG. 5 is a reproduction of FIG. 1 from the aforesaid Nandakumar, et al. article. The BRT can be turned-off by application of a negative bias to a P-channel enhancement-mode MOSFET to thereby reduce the resistance of the P-base by shunting majority charge carriers to the cathode. As will be understood by one skilled in the art, the reduction in P-base resistance results in an increase in the device's holding current to above the operational current level and shuts-off the device. Like the reported MCT structure, the BRT requires dual-polarity gate control for operation.

It would be preferable to provide a switching device operable with single-polarity gate control and without the limitation associated with the reported MCT. Moreover, it would also be preferable to have a structure capable of being processed with relatively few process steps, few number of masks and capable of being highly integrated across a semiconductor wafer.

Some of these preferred features can be found in U.S. Pat. No. 5,014,102, issued to Adler, entitled Mosfet-Gated Bipolar Transistors and Thyristors with Both Turn-On and Turn-Off Capability Having Single-Polarity Gate Input Signal. This patent discloses a triple-diffused MCT structure with separate enhancement and depletion-mode MOSFETs for providing turn-on and turn-off control, respectively. Turn-off control is provided by a separate termination region in the cathode region and by a P-channel depletion-mode MOSFET between the second base region and the termination region. The termination region is electrically connected to the cathode contact. Unfortunately, since the termination region is formed by diffusion into the cathode region, the cathode region is large in terms of its lateral dimensions, so that high integration densities may be difficult. Moreover, the fabrication process described for the Adler MCT requires a relatively costly triple-diffusion fabrication process when compared to the process for forming an EST or BRT, which are basically IGBT baseline processes, as reported in the above referenced articles on the EST and BRT. Another consequence of the cathode region being relatively large is the size of the second base region (P-region 174 in Adler) which is correspondingly large because the cathode region is in the second base region. As will be understood by one skilled in the art, the relatively large size of the second base region causes a respective increase in the majority carrier (charge) concentration in the second base when the thyristor is conducting and limits the maximum controllable current density, i.e., the range of on-state current values that can be turned off when a proper gate bias is applied.

Accordingly, a semiconductor switching device embodying the electrical and process features of an EST or BRT, and having single-polarity depletion-mode controlled turn-off is desired for applications requiring high maximum controllable current density, single-polarity power supply sources, and/or high lateral integration densities on a semiconductor substrate for high current applications. Moreover, for dual-polarity applications, it is also desirable for a semiconductor switching device to provide enhanced performance compared to single polarity applications.

SUMMARY OF THE INVENTION

It is therefore an object of the present invention to provide a thyristor-based semiconductor switching device operable with single-polarity gate control and high maximum controllable current density or operable with dual-polarity gate control and relatively higher maximum controllable current density.

It is another object of the present invention to provide a thyristor-based semiconductor switching device capable of being fabricated with relatively few processing steps, few number of masks, and with high integration densities.

These and other objects are provided, according to the present invention in a multilayered thyristor having an anode region, a first base region, a second base region, and a cathode region in the second base region. A high electrical conductivity diverter region, electrically connected to the cathode, is provided in the first base region, adjacent and outside the second base region. Turn-off gating means is provided between the diverter region and the second base region.

By applying a properly biased signal to the turn-off gating means, a "normally-on" channel comprising a doped region in the first base region can be maintained between the diverter region and the second base region. The doped region preferably has a conductivity type opposite the conductivity type of the first base region. The term "normally-on" describes the conductive state of the doped region, wherein an electrical path is provided connecting both ends of the doped region.

In addition, by changing the bias signal to the turn-off gating means, an accumulation-layer channel can also be provided in the doped region in parallel with the normally-on channel. As will be understood by one skilled in the art, an accumulation-layer channel is formed when the concentration of majority carriers is greater than the concentration of ionized dopant atoms in the doped region. The combination of an accumulation-layer channel in parallel with the normally-on channel provides a high conductivity electrical path between the second base region and diverter region.

The turn-off gating means is typically a P-channel depletion-mode MOSFET, or an N-channel depletion-mode MOSFET in a complementary structure. For a P-channel depletion-mode MOSFET, the electrical path comprising the normally-on channel remains conductive for a relatively small range of positive biases ("near-zero"). The range of positive biases can be adjusted by changing the acceptor impurity concentration in the doped region beneath the gate oxide. In the complementary structure, a range of negative biases can be adjusted by changing the donor impurity concentration in the doped region. In either case, however, the electrical path is provided to shunt majority carrier current between the second base region and the cathode region and turn off the device or maintain the device in an off state.

Turn-on gating means is also provided to electrically connect the cathode region to the first base region when a non-zero bias is applied. The turn-on gating means preferably comprises an N-channel enhancement-mode MOSFET enabled by an above-threshold positive bias, but may also comprise a P-channel enhancement-mode MOSFET in a complementary structure. The multilayered thyristor can also be turned on by any one of a number of conventional means, including light activation, etc. Moreover, if the gates of the preferred turn-on and turn-off gating means are electrically connected, the electrical path provided by the turn-off gating means will be disabled when the turn-on gating means is enabled and vice versa.

For a turn-off gating means comprising a P-channel depletion-mode MOSFET, disablement occurs when a positive bias signal with respect to the first base region is applied to the gate to thereby generate an electric field in the underlying gate oxide. This field causes the removal of mobile holes (majority charge carriers) in the doped region (P-type) and the formation of a depletion region therein. If the positive bias is sufficiently large, the entire doped region can become depleted of mobile charge carriers, with only negative acceptor ions remaining. When this happens, the electrical path between the second base region and the diverter region becomes disconnected. An analogous situation occurs when a sufficiently negative bias is applied to a turn-off gating means comprising a complementary structure.

In the preferred embodiment, the semiconductor switching device comprises either an EST or BRT device with a P-type anode region and an N-type cathode region. Moreover, although both on and off control are provided by a single-polarity bias signal, dual-polarity control is also possible to provide an increased maximum controllable current density. For example, when a negative bias is applied to a P-channel depletion-mode MOSFET, a high conductivity P-type accumulation-layer channel is provided in the doped region between the second base region and the diverter region. Accordingly, turn-off is preferably not provided by an inversion-layer channel having a lower electrical conductivity. Instead, turn-off is preferably provided by the formation of a normally-on channel in the doped region in response to a near-zero bias, or the formation of an accumulation-layer channel in the doped region in parallel with the normally-on channel in response to a negative bias, or positive bias for the complementary structure.

DESCRIPTION OF A PREFERRED EMBODIMENT

The present invention will now be described more fully hereinafter with reference to the accompanying drawings, in which a preferred embodiment of the invention is shown. This invention may, however, be embodied in many different forms including a complementary switching device and should not be construed as limited to the embodiment set forth herein. Rather, this embodiment is provided so that this disclosure will be thorough and complete, and will fully convey the scope of the invention to those skilled in the art. Like numbers refer to like elements throughout.

Figure 6:
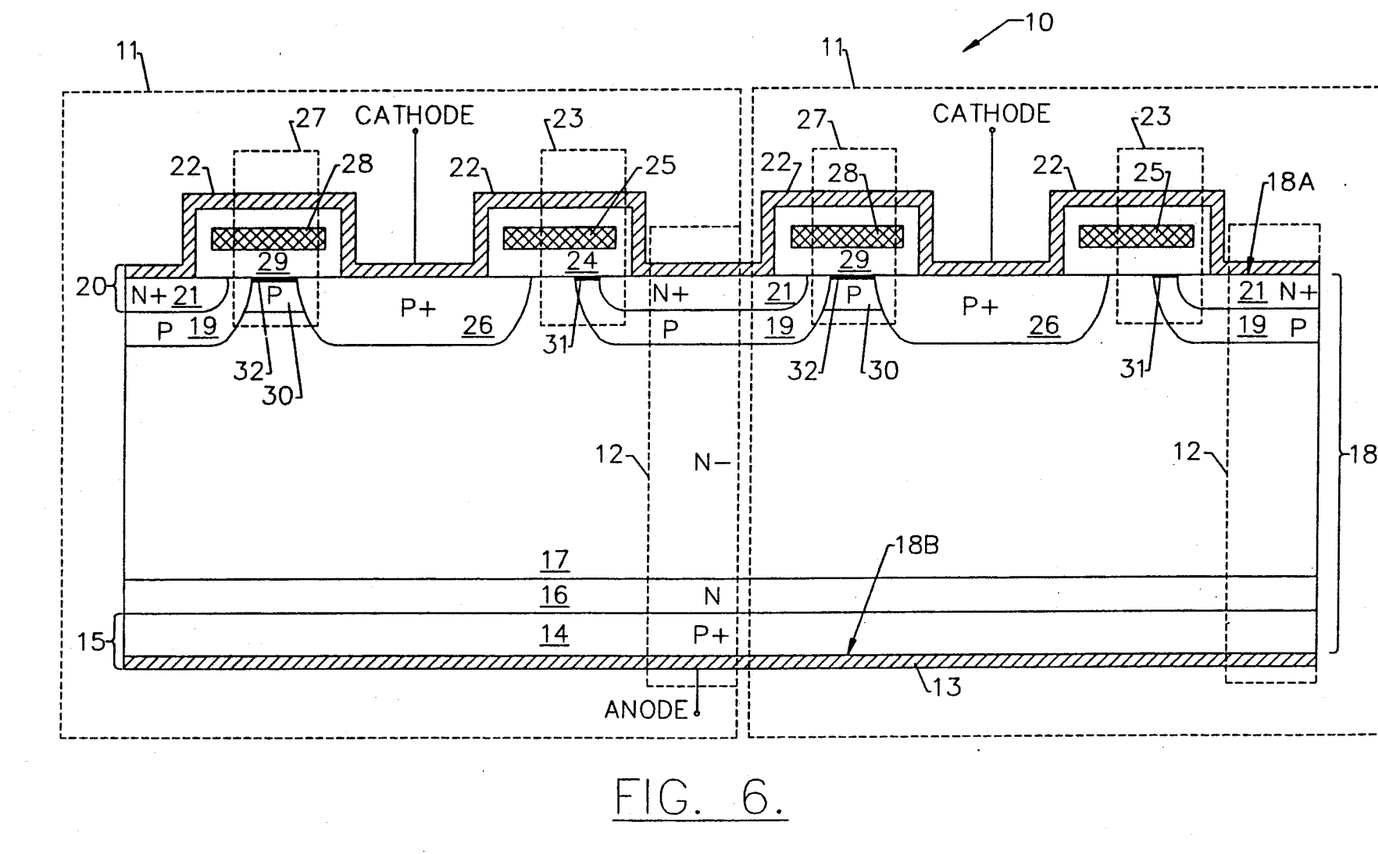
FIG. 6 illustrates a cross-sectional representation of a integrated semiconductor switching device according to a first embodiment of the present invention.

Referring now to FIG. 6, a cross-sectional representation of an integrated semiconductor switching device 10 according to a first embodiment of the present invention is shown comprising two semiconductor switching cells 11. Each switching cell 11 is shown having a thyristor portion 12 in a semiconductor substrate 18 having a first face 18A and second face 18B. The thyristor portion 12 comprises an anode region 15, first base region 17, second base region 19 and a cathode region 20 in the second base region 19. The anode region 15 comprises a metallization layer 13 at the second face 18B, and a P-type anode 14. In the preferred embodiment, an N-type buffer layer 16 is also provided on the P-type anode 14. A first base region 17 of N-type conductivity is provided on the buffer layer 16. The first base region preferably extends to the first face 18A, wherein the rest of the switching device is formed. A second base region 19 of p-type conductivity is also provided in the first base region 17. The cathode region 20 comprises an N-type cathode 21 in the second base region 19 and a cathode metal contact 22.

Although turn-on of the thyristor can be provided by a number of conventional means, a turn-on gating means comprising an N-channel enhancement-mode MOSFET 23 is shown. The MOSFET 23, including a gate insulating layer 24 and gate 25, is responsive to a positive bias. As will be understood by one skilled in the art, the application of a positive bias to the gate 25 causes the formation of an inversion-layer channel 31 in the second base region 19 at the first face 18A. This channel 31 provides an electrical connection between the cathode 21 and the first base region 17 and turns on the thyristor 12 when a positive bias with respect to the cathode 21 is applied to the anode region 15.

The switching device 11 of FIG. 6 further includes a diverter region 26 electrically connected to the cathode metal contact 22 and a turn-off gating means between the diverter region 26 and the second base region 19. The turn-off gating means, preferably comprising a P-channel depletion-mode MOSFET 27, is responsive to a negative gate bias. As shown by FIG. 6, the diverter region 26 is electrically connected to the second base region 19 by a P-type region 30 when a near-zero or negative bias is applied to gate 28. In the preferred embodiment gate 28 is electrically connected to gate 25. The gate 28 is electrically insulated from the P-type region 30 by a gate insulating layer 29.

In order to properly effectuate turn-on, however, the electrical connection between the diverter region 26 and the second base region 19 is controlled preferably by reducing the electrical conductivity of the P-type region 30. This can be done, for example, by simultaneously applying the turn-on gate bias to the turn-on and turn-off gating means, preferably by electrically connecting gates 25 and 28. Accordingly, during turn-on, the normally-on channel comprising the P-type region 30 is eliminated while the inversion-layer channel 31 is formed.

A reduction in the electrical conductivity of P-type region 30 can occur, for example, by depleting region 30 of positive charge carriers, commonly referred to as "holes," in response to positive bias being applied to gate 28. If the gate bias is sufficiently positive only negative acceptor ions will be left in region 30; the turn-off gating means will thereby be disabled.

Because of the depletion-mode MOSFET 27, the turn-off characteristics of the thyristor 12 are improved by the formation of an accumulation-layer channel 32 in region 30 at the first face 18A when a negative bias is applied to the gate 28. The negative bias also increases the electrical conductivity of the normally-on channel defined by the rest of the P-type region 30 outside the accumulation-layer channel 32. The two electrical paths are provided in parallel to reduce the total resistance between regions 26 and 19, Accordingly, because of the high mobility for majority carriers in the P-type region 30, the maximum controllable current density of a device according to the present invention is higher than the corresponding value for conventional devices wherein turn-off is provided by an inversion-layer channel between regions 26 and 19.

Figure 7:
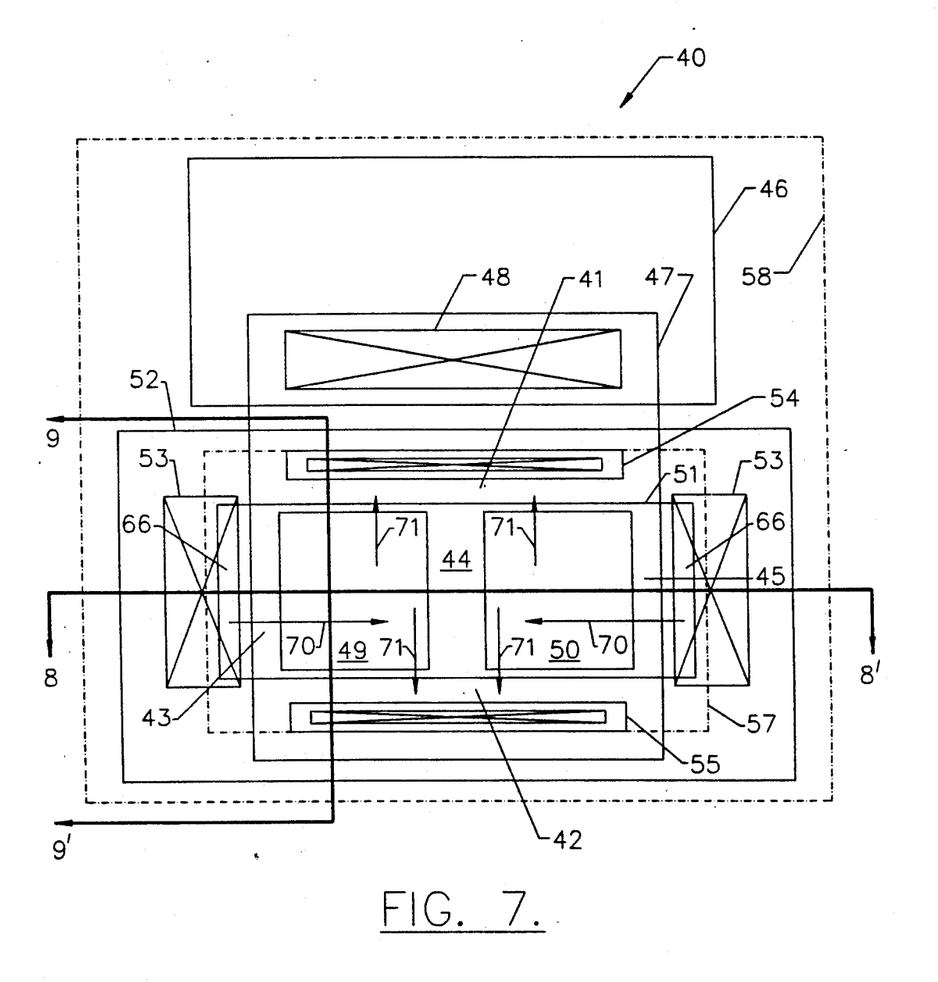
FIG. 7 illustrates a unit cell layout of a semiconductor switching device according to a second embodiment of the present invention.

Referring now to FIG. 7, a unit cell layout of a semiconductor switching device according to a second embodiment of the present invention is shown wherein solid and dotted lines are used to define the masking areas for the lithographic portion of the process. The unit cell 40 is a combination of two EST devices positioned in back to back relation, wherein a P-channel depletion-mode MOSFET is provided to improve the turn-off characteristics of the switching device. Accordingly, a turn-off gating means is provided comprising two P-channel depletion-mode MOSFETs 41 and 42 positioned in orthogonal relation to a turn-on gating means.

The turn-on gating means comprises three (3) N-channel enhancement-mode MOSFETs, 43, 44, and 45. Contact to the turn-on gating means is provided by a gate pad and gate, defined by mask regions 46 and 47, respectively. These regions are electrically, connected together by the gate contact defined by mask region 48. The two floating emitters of the EST are defined by mask regions 49 and 50. The mask region 51 is originally defined to provide the N+ emitter of the EST; however, during processing, the N+ emitter, regions 66 will be confined to the portion of mask region 51 outside mask region 47. This is because during processing, the mask region 47 of the N-channel enhancement-mode MOSFETs 43 and 45 acts as a mask to the subsequently formed N+ emitter regions 66. The N+ emitter regions 66 are electrically connected to the cathode metal defined by mask region 52 by contacts defined by mask region 53.

The P-channel depletion-mode MOSFETS 41 and 42 corresponding to the turn-off gating means are similarly connected to the cathode metal defined by mask region, 52 by contacts defined by mask regions 54 and 55. As will be understood by one skilled in the art, the P+ diverter region is defined within the edges of mask regions 57 and 58.

Accordingly, when a positive bias is applied to thereby enable the turn-on gating means, an N-type inversion-layer channel is formed in each of the enhancement-mode transistors 43, 44, 45 and an electrical connection is provided between the cathode metal defined by mask region 52 and the first base region, not shown. In the orientation of the regions shown in FIG. 7, enablement of the turn-on gating means causes an electron current to flow in the direction shown symbolically by arrows 70.

Similarly, when a near-zero positive bias or negative bias is applied to thereby enable the turn-off gating means, a hole current is set-up between the second base region (P-base) and the cathode metal defined by mask region 52 via contacts defined by mask regions 54 and 55. The hole current, shown symbolically by arrows 71 flows in a direction orthogonal to the direction of the electron current flow 70.

Figure 8:
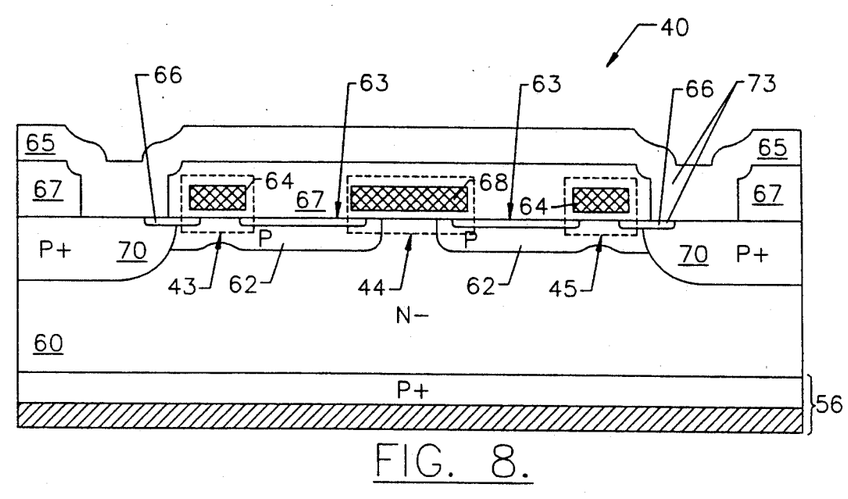
FIG. 8 illustrates a cross-sectional representation for the semiconductor switching device of FIG. 7, taken along line 8—8'.

Referring now to FIG. 8, a cross-sectional representation for the unit cell of FIG. 7, taken along line 8—8', is shown. The unit cell 40, comprising two back to back EST devices, is shown with an anode region 56, first base region 60, P+ region 70, second base regions 62, N+ emitter regions 66, and floating N+ emitter regions 63. The P+ region 70 is provided to reduce the likelihood of parasitic latch-up of the EST. The enhancement-mode MOSFETs for the turn-on gating means, having a channel type opposite the conductivity type of the second base region 62, include gates 64 and 68, within the gate insulating layer 67. The cathode metal is provided by a layer of metallization 65 which together with the N+ emitter region 66 comprises the cathode region. Accordingly, when a positive bias is applied to gates 64 and 68, N-type inversion-layer channels are formed at the surface of the second base regions 62, thereby electrically connecting the N+ emitter regions 66, the floating N+ emitters 63, and the first base region 60.

Figure 9:
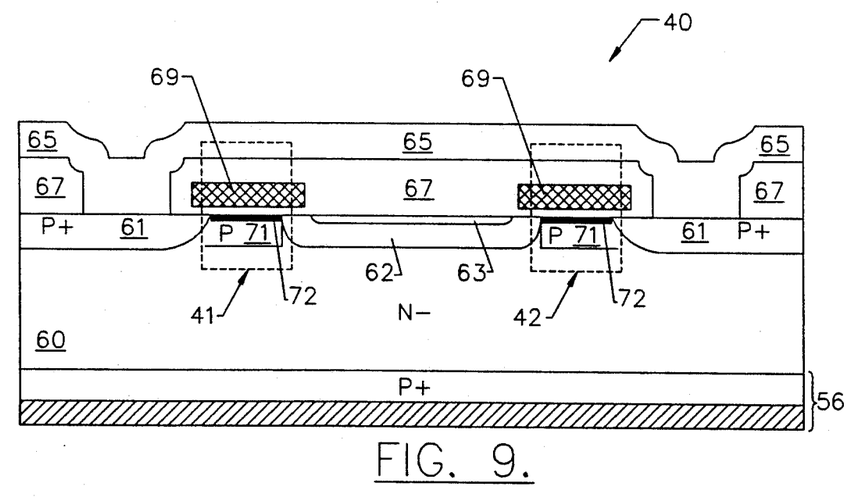
FIG. 9 illustrates a cross-sectional representation for the semiconductor switching device of FIG. 7, taken along line 9—9'.

Referring now to FIG. 9, a cross-sectional representation for the unit cell of FIG. 7, taken along an line B—B', is shown. As shown, the unit cell 40 further comprises a turn-off gating means having P-channel depletion-mode MOSFETs 41 and 42 in orthogonal relation to the turn-on gating means shown in FIG. 8. When a near-zero positive bias or negative bias is applied to gates 69, turn-off is enabled. This is because at near-zero positive bias, the drain (second base region 62) and source (diverter region 61) of the depletion-mode MOSFETs are electrically connected by a P-type normally-on channel 72. Thus, the turn-off gating means shunts current from the second base region 62 to the diverter region 61 to thereby turn-off the device. The turn-off gating means is preferably enabled by a negative bias to provide dual-polarity turn-on and turn-off control. As will be understood by one skilled in the art, a negative bias applied to gates 69 will also cause the formation of a low resistance accumulation-layer channel 72 (in parallel with the normally-on channel 71) between the second base 62 and diverter regions 61. The parallel combination of the two channels 71 and 72 maximizes the electrical conductivity between regions 61 and 62 and maximizes the controllable current density to thereby improve the device's turn-off characteristics.

Although not limited to the two embodiments respectively shown in FIG. 6 and FIGS. 7-9, the semiconductor switching device of the present invention comprises a thyristor having layered P1-N1-P2-N2 regions respectively comprising an anode region, a first base region, a second base region, and a cathode region in the second base region, or the reverse in a complementary structure. A high conductivity diverter region in the first base region, adjacent and outside the second base region, is also provided as the source of a P-channel depletion-mode MOSFET which is enabled by a near-zero positive voltage or negative voltage, depending on whether single- or dual-polarity controlled turn-off is preferred for a given application. The P-channel depletion-mode MOSFET comprises the turn-off gating means for shunting majority charge carriers to the cathode during turn-off. A high maximum controllable current density is obtained because of the high conductivity path provided between the second base region and the cathode region when the thyristor gate control approaches zero or becomes negative.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A semiconductor switching device comprising:
   a thyristor having an anode region, a first base region, a second base region, and a cathode region in said second base region;
   a diverter region in said first base region, outside and adjacent said second base region, and electrically connected to said cathode region; and
   turn-off gating means responsive to a first bias signal for forming an accumulation-layer electrically connecting said second base region to said diverter region to shunt current from said second base region to said cathode region.

2. The semiconductor switching device of claim 1, wherein said turn-off gating means comprises a depletion-mode field effect transistor of channel type opposite the conductivity type of said first base region.

3. The semiconductor switching device of claim 2, wherein said diverter region and said second base region are of first conductivity type.

4. The semiconductor switching device of claim 2, wherein said depletion-mode field effect transistor comprises a MOSFET.

5. The semiconductor switching device of claim 2, further comprising turn-on gating means for electrically connecting said cathode region and said first base region in response to a second bias signal.

6. The semiconductor switching device of claim 5, wherein said turn-on gating means comprises an enhancement-mode field effect transistor between said cathode region and said first base region, said enhancement-mode field effect transistor having a channel conductivity type opposite the conductivity type of said second base region.

7. The semiconductor switching device of claim 6, wherein said enhancement-mode field effect transistor comprises a MOSFET.

8. The semiconductor switching device of claim 6, wherein the gates of said enhancement-mode and said depletion-mode field effect transistors are electrically connected.

9. The semiconductor switching device of claim 5, wherein said turn-off gating means and said turn-on gating means are responsive to a common bias signal; and wherein enablement of said turn-on gating means occurs simultaneously with disablement of said turn-off gating means in response to the common bias signal.

10. A semiconductor switching device comprising:

a semiconductor substrate;
a thyristor in said semiconductor substrate, said thyristor having an anode region, a first base region, a second base region, and a cathode region;
a floating emitter region in said second base region;
a diverter region in said first base region and outside and adjacent said second base region, electrically connected to said cathode region; and
turn-off gating means responsive to a first bias signal for forming an accumulation-layer electrically connecting said second base region to said diverter region to shunt current from said second base region to said cathode region.

11. The semiconductor switching device of claim 10, wherein said turn-off gating means comprises a depletion-mode field effect transistor of channel type opposite the conductivity type of said first base region.

12. The semiconductor switching device of claim 11, wherein said diverter region and said second base region are of first conductivity type.

13. The semiconductor switching device of claim 11, wherein said depletion-mode field effect transistor comprises a MOSFET.

14. The semiconductor switching device of claim 11, further comprising turn-on gating means for electrically connecting said cathode region, said floating emitter region and said first base region in response to a second bias signal.

15. The semiconductor switching device of claim 14, wherein said turn-on gating means comprises an enhancement-mode field effect transistor between said cathode region and said first base region, said enhancement-mode field effect transistor having a channel conductivity type opposite the conductivity type of said second base region.

16. The semiconductor switching device of claim 15, wherein said enhancement-mode field effect transistor comprises a MOSFET.

17. The semiconductor switching device of claim 14, wherein said turn-off gating means and said turn-on gating means are responsive to a common bias signal; and wherein enablement of said turn-on gating means occurs simultaneously with disablement of said turn-off gating means in response to the common bias signal.

18. A semiconductor switching device comprising:
a semiconductor substrate;
a thyristor in said semiconductor substrate, said thyristor having an anode region, a first base region, a second base region, and a cathode region;
a floating emitter region in said second base region;
a diverter region in said first base region and outside and adjacent said second base region, electrically connected to said cathode region; and
turn-off gating means responsive to a first bias signal for forming an accumulation-layer electrically connecting said second base region to said diverter region to shunt current from said second base region to said cathode region in a first direction; and
turn-on gating means responsive to a second bias signal for electrically connecting said cathode region, said floating emitter region and said first base region and providing conduction between said cathode and said first base region in a second direction.

19. The semiconductor switching device of claim 18, wherein said first direction and said second direction are orthogonal to one another.

20. The semiconductor switching device of claim 18, wherein said turn-off gating means comprises a depletion-mode field effect transistor of channel type opposite the conductivity type of said first base region.

21. The semiconductor switching device of claim 20, wherein said diverter region and said second base region are of first conductivity type.

22. The semiconductor switching device of claim 20, wherein said depletion-mode field effect transistor comprises a MOSFET.

23. The semiconductor switching device of claim 20, wherein said turn-on gating means comprises an enhancement-mode field effect transistor between said cathode region and said first base region, said enhancement-mode field effect transistor having a channel conductivity type opposite the conductivity type of said second base region.

24. The semiconductor switching device of claim 23, wherein said enhancement-mode field effect transistor comprises a MOSFET.

25. The semiconductor switching device of claim 23, wherein said turn-off gating means and said turn-on gating means are responsive to a common bias signal; and wherein enablement of said turn-on gating means occurs simultaneously with disablement of said turn-off gating means in response to the common bias signal.

* * * * *

UNITED STATES PATENT AND TRADEMARK OFFICE
CERTIFICATE OF CORRECTION

PATENT NO. : 5,198,687        Page 1 of 2

DATED : March 30, 1993

INVENTOR(S) : Bantval J. Baliga

It is certified that error appears in the above-identified patent and that said Letters Patent is hereby corrected as shown below:

On the Title page, item [54] and col. 1, lines 1-2,
In the title, insert -- A -- at the beginning; after "Single-Polarity" insert -- and Dual-Polarity --

Title page, item [56]
In the References, "Shinobe" should be -- Shinohe --

Title page, item [56]
In the References, Bauer 5,105,244, "5/1992" should be -- 4/1992 --

Title page, item [56]
In the References, Col. 2, line 9, after "Electron" insert -- Device --

Col. 1, line 64, "A cm$^2$" should be -- A/cm$^2$ --

Col. 2, lines 7-8, "Three Terminal" and "MOS Controlled" should be hyphenated; "Trans." should be -- Transactions on --

Col. 3, line 7, omit "The"; "Thyristor" should be --Thyristors (MCT's) --

Col. 7, line 32, "p-type" should be -- P-type --

Col. 8, line 21, after "19", the comma should be a period.

Col. 8, line 45, after "electrically", omit the comma.

UNITED STATES PATENT AND TRADEMARK OFFICE
CERTIFICATE OF CORRECTION

PATENT NO. :    5,198,687
DATED      :    March 30, 1993
INVENTOR(S) :   Bantval J. Baliga It is certified that error appears in the above-identified patent and that said Letters Patent is hereby corrected as shown below:

Col. 8, line 50, after "emitter" omit the comma.

Col. 8, line 57, after "contacts" insert a comma.

Col. 8, line 61, after "region" omit the comma.

Col. 9, lines 11-12, omit "defined by mask region"

Col. 9, line 30, after "region" insert -- 73 --

Col. 9, line 37, omit "an" before "line"

Signed and Sealed this

Twenty-first Day of December, 1993

Attest:

BRUCE LEHMAN

Attesting Officer        Commissioner of Patents and Trademarks